United States Patent [19]

Horner

[11] Patent Number: 4,617,512
[45] Date of Patent: Oct. 14, 1986

[54] CAPACITANCE MEASURING DEVICE INCLUDING AN OVERRANGE CIRCUIT

[76] Inventor: Joseph L. Horner, 76 Brattle St., Cambridge, Mass. 02138

[21] Appl. No.: 511,076

[22] Filed: Jul. 5, 1983

[51] Int. Cl.[4] .............................................. G01R 27/26
[52] U.S. Cl. ................................ 324/60 CD; 324/115
[58] Field of Search ............ 324/60 C, 60 CD, 60 R, 324/61 R, 115, 51; 340/662

[56] References Cited

U.S. PATENT DOCUMENTS

| | | | |
|---|---|---|---|
| 2,940,037 | 6/1960 | Lide | 324/60 |
| 3,986,108 | 10/1976 | Thomas | 324/60 C |
| 4,173,736 | 11/1979 | Adams | 324/51 |
| 4,282,480 | 8/1981 | Fujito et al. | 324/61 R |
| 4,295,091 | 10/1981 | Ponkala | 324/60 CD |

FOREIGN PATENT DOCUMENTS 0781712  11/1980  U.S.S.R. ............................ 324/60 R

OTHER PUBLICATIONS

Rao et al., A Novel Capacitance Meter, 4-1978, 70-74.
Horner, Joseph L., "What's Your Capacity," *Optical Engineering*, Mar./Apr. 1983, vol. 22, No. 2, p. SR-044.

*Primary Examiner*—Reinhard J. Eisenzopf
*Assistant Examiner*—Jack B. Harvey
*Attorney, Agent, or Firm*—Donald J. Singer; Jacob N. Erlich

[57] ABSTRACT

A capacitance measuring device having an astable multivibrator, a monostable multivibrator, a metering circuit and an overrange circuit. The astable multivibrator generates a repetitive series of evenly spaced pulses which are received by the monostable multivibrator to which a capacitor of unknown value is connected. Each of the pulses initiating a voltage output in the monostable multivibrator which remains in the high state for a length of time linearly proportioal to the value of the unknown capacitor. Thereafter, the voltage output of the monostable multivibrator reverts to the low state and remains at the low state until it receives the next one of the repetitive pulses. The metering means averages the high and low states of the voltage output and provides a pair of average voltage readings indicative of capacitance value of the unknown capacitance. One of the average voltage readings being a true reading of the value of the unknown capacitor and the other of the average voltage readings being a false reading of the value of the unknown capacitor. The overrange circuit provides an indication when the reading of capacitance value is false thereby enabling a user of the device to disregard this reading.

7 Claims, 6 Drawing Figures

4,617,512

CAPACITANCE MEASURING DEVICE INCLUDING AN OVERRANGE CIRCUIT

STATEMENT OF GOVERNMENT INTEREST

The invention described herein may be manufactured and used by or for the Government for governmental purposes without the payment of any royalty thereon.

BACKGROUND OF THE INVENTION

This invention relates generally to capacitance measuring devices, and, more particularly, to a capacitance measuring device which includes the capability of providing an indication of overrange measurements.

Capacitors are found in most of todays electronic circuits. Therefore, in either analyzing such circuits or building such circuits, it is necessary to actually determine the value of the capacitors utilized therein. In many instances, however, capacitors are impossible to mark. They are frequently of a small physical size, which precludes printing a number of them.

In the past, various forms of bridge-type testing devices have been employed in order to ascertain the value of such capacitors. These devices usually are in the form of a Wheatstone bridge which operates on the principle of comparison or balance of capacitances. Unfortunately, such devices are extremely costly and are also subject to change of values of the elements in the bridge circuit, per se, and therefore require frequent calibration. Another device which has shortcomings, provides capacitance values by measuring the charging or discharging current. Furthermore, difficulties have been encountered when employing either of the above systems which stem largely from the fact that daily calibration is required and special procedures must be followed in operating the bridge network which, for example, requires technical skill and training.

A capacitance meter which overcomes some of the drawbacks associated with past capacitance measuring devices is set forth in U.S. Pat. No. 2,940,037. The invention described therein employs a "free running" multivibrator which generates a wave-form having a predetermined time constant. This generated signal is differentiated by a pulse shaping circuit and then applied to trigger a monostable multivibrator having a micro-ammeter placed in the circuit of the normally "off" side thereof. The monostable multivibrator has a quasi-stable state determined by an unknown capacitor undergoing test and, for a fixed driving frequency, the average value of current through the meter is determined by the duration of the quasi-stable state of the monostable multivibrator. Unfortunately, the capacitance meter of the type set forth above, is incapable of ascertaining whether or not the tested capacitor falls within the preselected range of the capacitance meter. In addition, the particular electronic components chosen for this capacitance meter have inherent drawbacks associated therewith.

Therefore, it is highly desirable to provide a device, capable of ascertaining capacitor values which is inexpensive to manufacture, simplistic in design, portable, self-calibrating and highly accurate in making such capacitance measurements.

SUMMARY OF THE INVENTION

The present invention overcomes the problems encountered in the past and as set forth in detail hereinabove by providing a capacitance meter or measuring device which effectively determines capacitor values as well as providing an indication that these values fall within the preselected range of the measuring device.

The present invention incorporates therein a power source, preferably portable and, for example, in the form of a 9 volt battery, an astable multivibrator and a monostable multivibrator (both of which incorporate therein readily available, conventional integrated circuit chips), an overrange circuit, and a metering circuit. The frequency of the integrated circuit forming part of the astable multivibrator is controlled by a plurality of resistors selectable by a range switch and a capacitor. The output of the astable multivibrator is inverted by a NAND gate. When the output of the NAND gate goes low it triggers the monostable multivibrator. In so doing the output of the monostable multivibrator goes high and stays high for a length of time, t, determined by a plurality of resistors selectable by the above-mentioned range switch and the unknown capacitor to be tested. At the end of time, t, the output of the monostable multivibrator goes low and stays low until it receives the next trigger pulse from the astable multivibrator through the NAND gate. In other words, the output of the monostable multivibrator is a signal of constant period whose on-time is directly proportional to the value of the unknown capacitor to be tested.

The overrange circuit forming part of the present invention is made up of a plurality of integrated circuit chips (one of which being the above-mentioned NAND gate) in conjunction with a transistor and a light emitting diode. During normal operation the output from the monostable multivibrator is generally high for the length of time, t, defined above. If the unknown capacitor has a value larger than the full scale value selected by the range switch of the capacitance measuring device of this invention, the output from the monostable multivibrator stays high longer than a time, T, representative of the time between pulses from the astable multivibrator. As a consequence the high output of the monostable multivibrator extends into the next trigger pulse cycle even though to all appearances the meter reads some mid-scale value. The uniquely designed overrange circuit included as part of the present invention detects this condition in order to actuate the light emitting diode. The light emitting diode provides an indication that the range switch of the capacitance measuring device of this invention should be advanced to accommodate the value of the unknown capacitor so that the true value of the unknown capacitor can be ascertained.

The capacitance measuring device of this invention is inherently accurate and stable for two reasons. First, the accuracy depends only on the ability of the metering circuit to read the average value of a constant amplitude waveform; that is, it does not depend on balancing currents, or a comparison measurement to a calibrated standard, etc. The metering circuit averages extremely well due to its very low frequency response compared to the frequency of the driving waveform Secondly, the components which make up the present invention are virtually immune to errors caused by variations in the supply voltage. This is because the integrated circuit chips, as well as the metering circuit, are insensitive to supply voltage changes.

It is therefore an object of this invention to provide a capacitance measuring device which is capable of providing an accurate measurement of an unknown capacitor.

It is another object of this invention to provide a capacitance measuring device which is capable of providing an indication if the value of the unknown capacitor is beyond the selected range of the device.

It is still another object of this invention to provide a capacitance measuring device which is extremely simplistic in design.

It is a further object of this invention to provide a capacitance measuring device which is portable.

It is even another object of this invention to provide a capacitance measuring device which is highly accurate and self-calibrating, thereby requiring only zeroing adjustment.

It is still a further object of this invention to provide a capacitance measuring device which is economical to produce and which utilizes conventional, currently available components that lend themselves to standard mass producing manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

DETAILED DESCRIPTION OF THE PREFERRED EMBODIMENT

Figure 1:
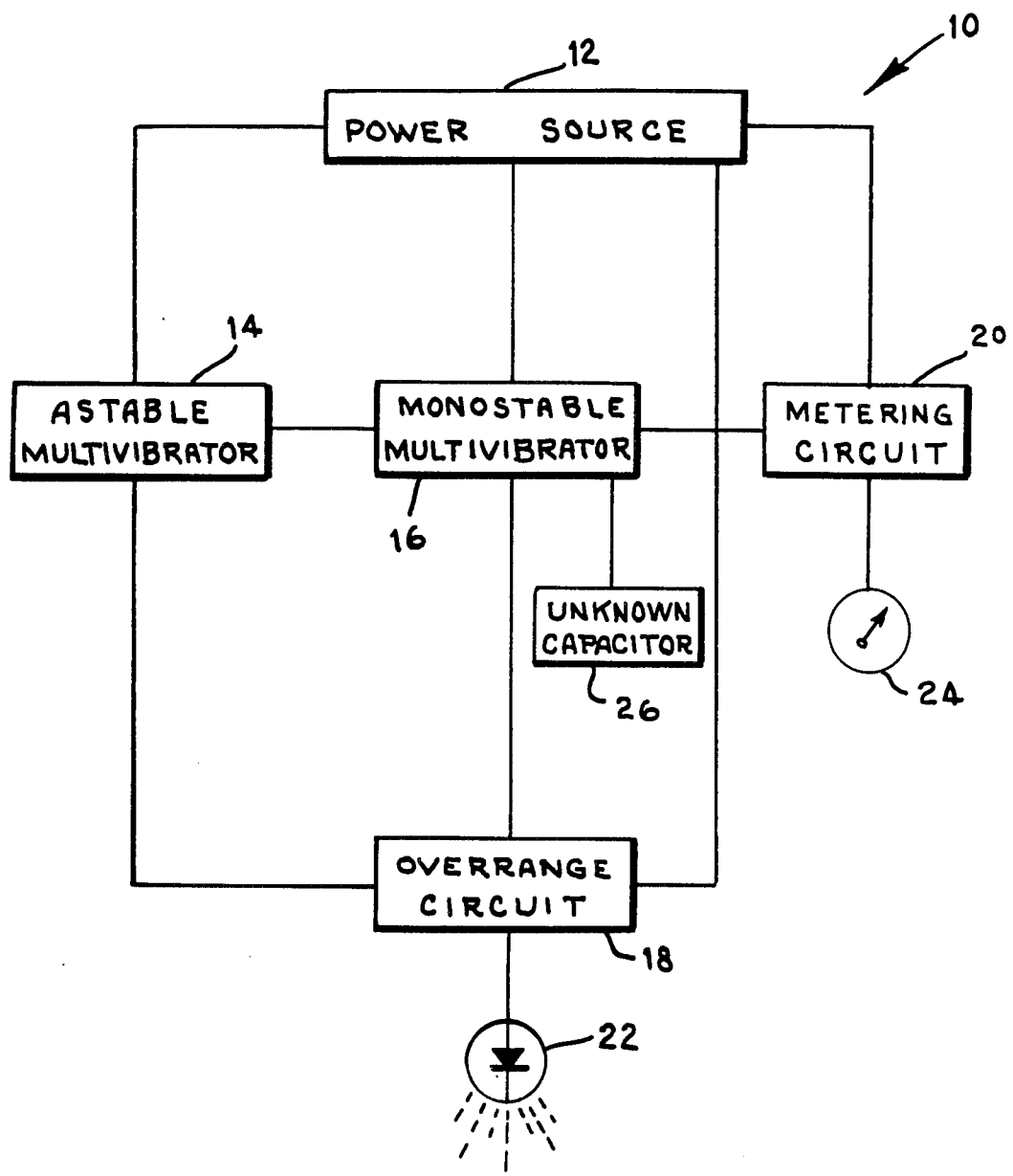
FIG. 1 is a block diagram of the capacitance measuring device of the present invention.

For an overall understanding of the capacitance measuring device 10 of this invention, reference is initially made to the block diagram set forth in FIG. 1 of the drawing. As illustrated therein power is supplied to the components of the capacitance measuring device 10 by any suitable power source 12 which may be in the form of a conventional 9 volt battery. Such a power source enables the capacitance measuring device 10 to be portable. Power source 12 provides power directly to the major components of measuring device 10 which include an astable multivibrator 14, a monostable multivibrator 16, an overrange circuit 18, and a metering circuit 20, all of which will be described in greater detail hereinbelow with respect to FIG. 2 of the drawing. Also illustrated in FIG. 1 is a conventional light emitting diode or warning indicator 22 which is part of overrange circuit 18 and a standard meter 24 which forms part of metering circuit 20. The unknown capacitor whose value is to be determined is directly connected to monostable multivibrator 16 and is represented in FIG. 1 by element 26.

Figure 2:
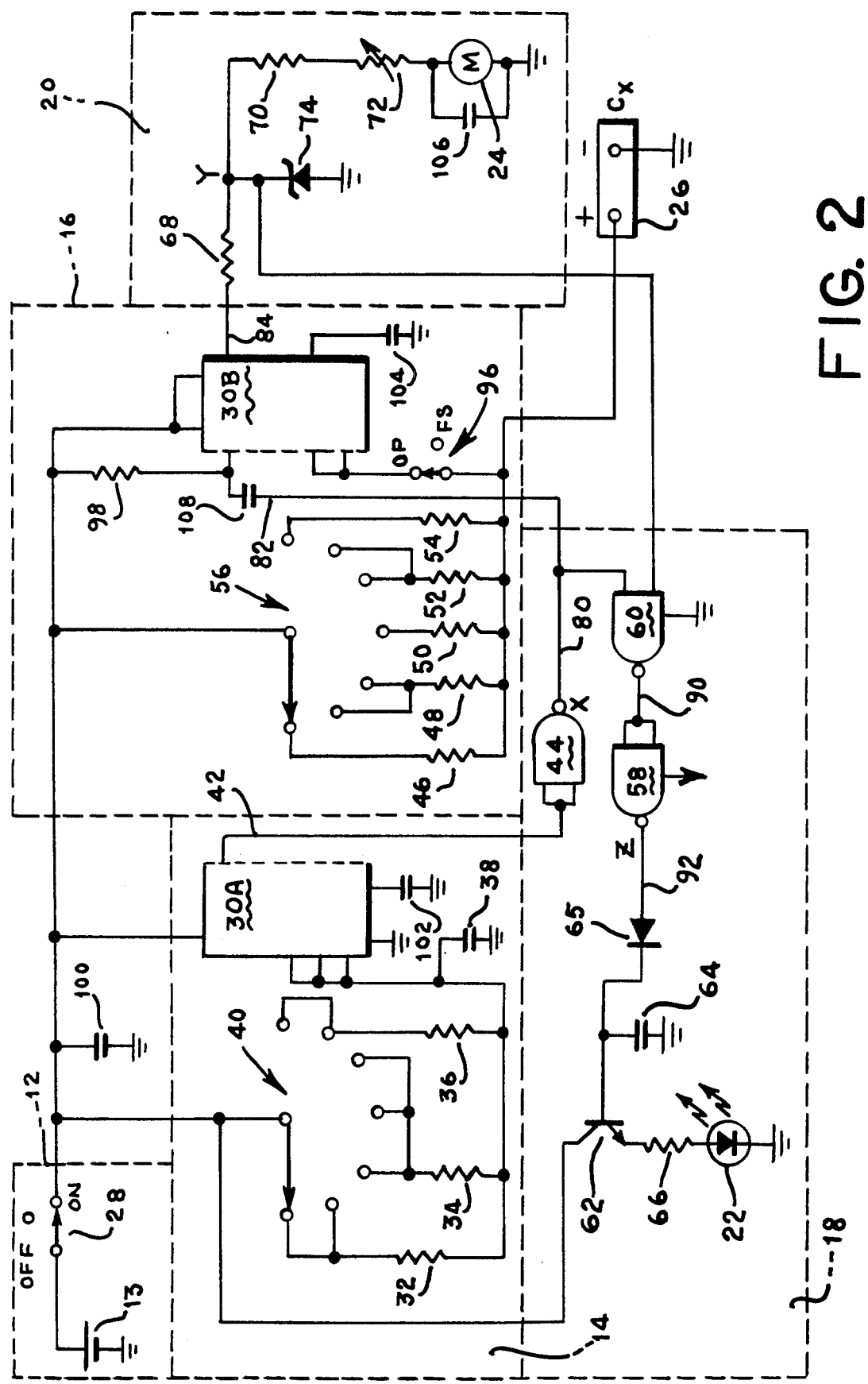
FIG. 2 is a detailed, schematic diagram of the capacitance measuring device of the present invention.

Reference is now made to FIG. 2 of the drawing for a more detailed description of the various components of capacitance measuring device 10. As clearly shown in FIG. 2 of the drawing each major component is set out in dashed lines in order to simplify the relationship between the components. Furthermore, as set forth hereinabove, power from the power supply 12 which, for example, is in the form of a battery 13 can be easily activated by on-off switch 28.

Making up astable multivibrator 14 is an oscillator in the form of one-half of a conventional, readily available, No. 556 integrated circuit chip designated as element 30A. The other half of the integrated circuit chip is designated 30B and its operation in the circuit of capacitance measuring device 10 is set forth below. The frequency of chip 30A is controlled by a plurality of selectable resistors 32, 34 and 36 and capacitor 38 which form part of a range switch 40. The output 42 of astable multivibrator 14 is inverted by a NAND gate 44 in the form of a readily available IC No. 4011, formed as part of overrange circuit 18 which will be described in greater detail hereinbelow.

Continuing with the description of the components, reference is now made to the monostable multivibrator 16. Multivibrator 16 includes a plurality of selectable resistors 46, 48, 50, 52 and 54 which form part of range switch 56. It should be noted that switches 40 and 56 may be mechanically linked together in order to act synchronously and therefore, may, in effect, be considered a single switching element. Resistors 46, 48, 50, 52 and 54 control the charging time of the unknown capacitor 26. The major element of monostable multivibrator 16 is the other half of the conventional, readily available No. 556 integrated circuit chip designated as element 30B. As seen in FIG. 2 the output 80 of NAND gate 44 becomes the input 82 of monostable multivibrator 16 and is received by integrated chip 30B. In addition, the unknown capacitor 26, whose value is to be determined, is connected to integrated chip 30B. An initiation switch 96 is interconnected between capacitor 26 and monostable multivibrator 16.

The overrange circuit 18 incorporates therein the already referred to NAND gate 44, an integrated NAND circuit chip 58, and an integrated NAND circuit chip, 60, acting as an inverter, (each of which may be in the form of a readily available IC No. 4011) a diode 65, a transistor 62, its associated capacitor 64 and resistor 66 as well as light emitting diode 22.

The metering circuit 20 receives the output 84 of monostable multivibrator 16. Metering circuit 20 is electrically connected to monostable multivibrator 16 and includes a pair of resistors 68 and 70, a variable resistor 72, a Zener diode 74, and a conventional meter 24.

Although values for the components making up capacitance measuring device 10 of the present invention may vary in accordance with the intended use and range of the device, an operative example of the values of such components is set forth below. With such values the capacitance measuring device 10 of the present invention is capable of measuring unknown capacitance values between 500 picofarads and 500 microfarads.

Resistor 32=5.6 K ohms; Diode 65=1N 4004
Resistor 34=56 K ohms; Diode 74=1N 4735
Resistor 36=560 K ohms; Transistor 62=2N 3904
Resistor 46=3.3 Megohms; Meter 24=100 microamperes
Resistor 48=330 K ohms; Capacitor 38=0.47 microfarads
Resistor 50=33 K ohms; Capacitor 64=1.0 microfarads
Resistor 52=3.3 K ohms; Capacitors 100,102,104=0.1 microfarads ea.
Resistor 54=330 K ohms; Capacitor 106=100 microfarads
Resistor 66=220 K ohms; Capacitor 108=0.001 microfarads Resistor 68=2.2 K ohms
Resistor 70=56 K ohms
Resistor 72=10 K ohms
Resistor 98=12 K ohms Still referring to FIGS. 1 and 2 of the drawing the following description sets forth the specific interconnection of the components as well as the operation of the capacitance measuring device 10 of this invention. As stated above, the unknown capacitor 26 is electrically connected to the monostable multivibrator 16 while power for the device is provided by power supply 12.

To operate the capacitance measuring device 10 of this invention, an initiation switch 96 interconnecting the unknown capacitor 26 with monostable multivibrator 16 is initially placed in the full scale (FS) position. This makes the output 84 of monostable multivibrator 16 continuously high. Variable resistor 72 of metering circuit 20 is then adjusted for a full scale deflection of meter 24. Thereafter, switch 96 is moved to the operate (OP) position and the capacitance measuring device 10 is ready for use in the manner indicated below.

As operation commences, the output 42 from integrated circuit 30A of astable multivibrator 14 is inverted by NAND gate 44. When the output 80 (input 82) of NAND gate 44 goes low, it triggers monostable multivibrator 16. As a result, the output 84 of monostable multivibrator 16 goes high and stays high for a length of time, t, wherein t is defined by the following equation:

$$t = KRC_X$$

where
K = a constant determined by multivibrator 16 (approx. 1.1 for the No. 556 IC chip)
$C_X$ = the value of the unknown capacitor 26.
R = the value of either resistor 46, 48, 50, 52 or 54 as selected by range switch 56.

At the end of time, t, the output 84 of monostable multivibrator 16 goes low and stays low until the next trigger pulse from the astable multivibrator 14. In other words, the output 84 is a signal of constant period whose on-time is directly proportional to the value of the unknown capacitor 26.

If we designate time, T, as the period of the trigger pulses from astable multivibrator 14, then the average voltage of output 84 is defined by the following equation:

$$V_{AVE} = V_o t/T = 1.1 \, RC_X V_o/T$$

where
$V_o$ is the magnitude of the voltage of output 84 of integrated circuit 30B when the output is high.

Resistor 68 and Zener diode 74 of metering circuit 20 maintain a fixed voltage when the output 84 of monostable multivibrator 16 is high, thus eliminating spurious meter readings caused by fluctuation in power supply voltage 12. It is the metering circuit 20 which measures this average voltage, $V_{AVE}$, and displays $V_{AVE}$ on meter 24.

Figure 3A:
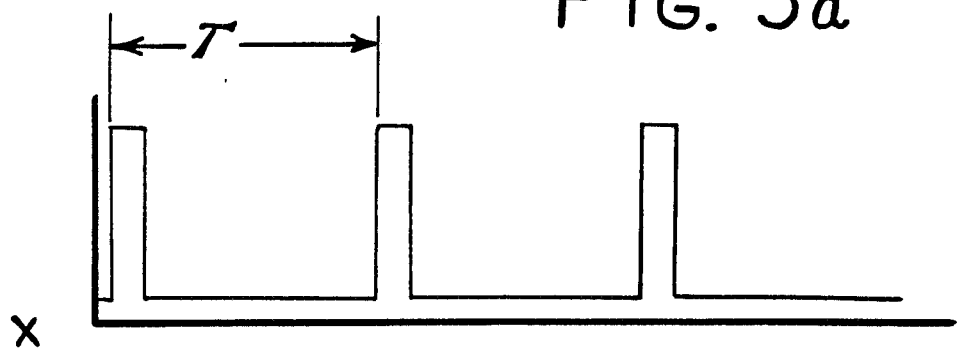
FIGS. 3a-d are graphic representations of outputs at various points in the circuit of the capacitance measuring device of the present invention.
Figure 3B:
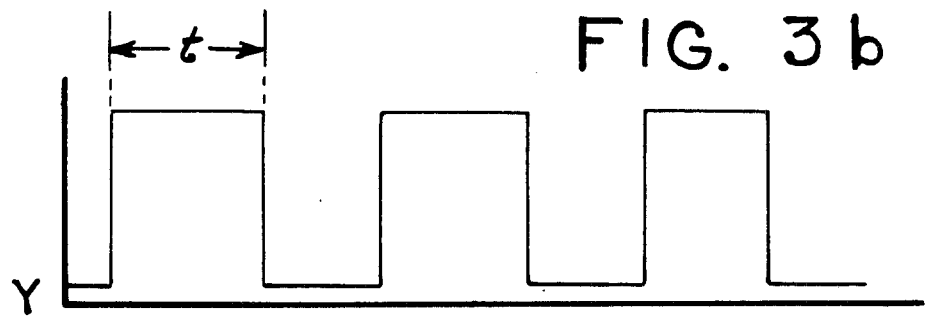
Figure 3C:
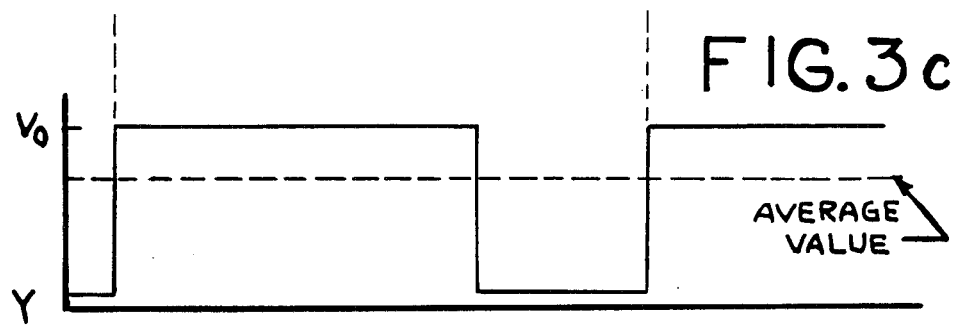
Figure 3D:
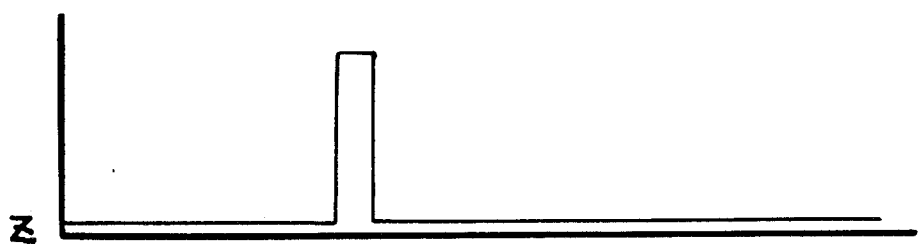

Reference is now made to the overrange circuit 18 which prevents ambiguous readings on meter 24. This can be more easily understood with reference to the graphs of FIGS. 3a, b, c and d and the following table. FIG. 3a illustrates the trigger pulse at point X in the capacitance measuring circuit, which is at the output 80 from NAND gate 44. FIG. 3b shows the normal operation at point Y which is the regulated output 84 of integrated circuit chip 30B of monostable multivibrator 16. This output 84 normally remains high for the length of time, t, defined above. FIG. 3c illustrates what will occur if the value of the unknown capacitor 26 is larger than the value of the scale selected by switches 40 and 56. In this case the output 84 (point Y) remains in the high state longer than time, T, thereby extending into the next trigger pulse cycle of astable multivibrator 14. Unfortunately, to all appearances the reading at meter 24 will read some mid-scale value indicated by the dashed line in FIG. 3c. That is, meter 24 provides an untrue or false reading of the value of unknown capacitor 26 which is not apparent to operator. This condition is detected by integrated circuit chips 60 and 58 of overrange circuit 18 and its output 90 is represented at point Z and shown in FIG. 3d. A logic truth table is set forth below representative of this operation:

| POINT X | POINT Y | POINT Z | METER READING |
|---|---|---|---|
| 1 | 1 | 1 | OVERRANGE |
| 0 | 1 | 0 | NORMAL |
| 1 | 0 | 0 | NORMAL |
| 0 | 0 | 0 | NORMAL |

In the above table, the overrange condition is defined by a high signal "1" occurring simultaneously at both points X and Y. In the overrange circuit, integrated circuit chip 58 is a NAND gate wired as an inverter and its output 92 is normally low. However, when the above "overrange" condition is met, the output 92 of NAND gate 58 goes high. This turns on transistor 62 which in turn turns on the warning light in the form of light emitting diode 22.

Actual value readings of the unknown capacitor 26 can be read directly on meter 24. If the value of the unknown capacitor 26 is greater than the preselected value set for meter 24, a warning indication is provided by light emitting diode 22. At that point the range switches 40, 56 are simultaneously moved (higher) to another position in order to increase the full scale reading of meter 24 thereby providing an accurate and highly reliable measurement of the value of unknown capacitor 26.

Although this invention has been described with reference to a particular embodiment, it will be understood that this invention is also capable of further and other embodiments within the spirit and scope of the appended claims.

I claim:
1. A capacitance measuring device for determining the capacitance value of an unknown capacitor, said capacitance measuring device comprising:
  means for generating a repetitive series of evenly spaced pulses;
  means, having said unknown capacitor electrically connected thereto, for receiving said repetitive pulses, each of said pulses initiating a voltage output from said pulse receiving means, said voltage output from said pulse receiving means remaining in a high state for a length of time linearly proportional to said capacitance value of said unknown capacitor, and thereafter said voltage output reverting to a low state and remaining at said low state for the length of time it takes said pulse receiving means to receive the next one of said repetitive pulses;

metering means for receiving said output voltage from said pulse receiving means and averaging said high and low states of said voltage output, said metering means having a preselected full scale range, said metering means providing a first average voltage reading indicative of said capacitance value of said unknown capacitor when the length of time of said voltage output from said pulse receiving means is equal to or less than the length of time between said evenly spaced pulses, said metering means providing a second average voltage reading indicative of said capacitance value of said unknown capacitor when the length of time of said voltage output from said pulse receiving means is greater than the length of time between said evenly spaced pulses, both said first average voltage reading and said second average voltage reading falling within said full scale range of said metering means, said first average voltage reading being a true indication of said capacitance value of said unknown capacitor, and said second average voltage reading being a false indication of said capacitance value of said unknown capacitor; and said pulse generating means and said pulse receiving means including means for varying said preselected full scale range of said metering means; and means operably connected between said pulse receiving means and said metering means for distinguishing between said first average voltage reading and said second average voltage reading and providing a signal when said second average voltage reading is present, and said means for providing a signal when said second average voltage reading is present including a plurality of NAND gates, a diode connected to one of said plurality of NAND gates, a transistor connected to said diode, a capacitor connected between said diode and said transistor, a resistor connected to said transistor and a light emitting diode connected to said resistor;

whereby said false indication for capacitance value can be disregarded.

2. A capacitance measuring device as defined in claim 1 wherein said range varying means comprises a plurality of selectable resistors and a switching means selectively interconnectable thereto.

3. A capacitance measuring device as defined in claim 1 wherein said pulse generating means comprises an astable multivibrator.

4. A capacitance measuring device as defined in claim 3 wherein said pulse receiving means comprises a monostable multivibrator.

5. A capacitance measuring device as defined in claim 4 wherein said astable multivibrator comprises an oscillator, a plurality of selectable resistors electrically connected to said oscillator, and a range switch selectively interconnectable to said resistors.

6. A capacitance measuring device as defined in claim 5 wherein said monostable multivibrator comprises said oscillator, another plurality of selectable resistors electrically connected to said oscillator, and another range switch selectively interconnectable to said another plurality of resistors.

7. A capacitance measuring device as defined in claim 6 wherein said metering means comprises a plurality of resistors electrically connected to said oscillator, and a diode and a meter electrically connected to said resistors.

* * * * *